United States Patent [19]

Brunner et al.

[11] Patent Number: 5,268,638
[45] Date of Patent: Dec. 7, 1993

[54] METHOD FOR PARTICLE BEAM TESTING OF SUBSTRATES FOR LIQUID CRYSTAL DISPLAYS (LCD)

[75] Inventors: Matthias Brunner, Kirchheim; Reinhold Schmitt, Munich, both of Fed. Rep. of Germany

[73] Assignee: Siemens Aktiengesellschaft, Munich, Fed. Rep. of Germany

[21] Appl. No.: 882,657

[22] Filed: May 13, 1992

[30] Foreign Application Priority Data

Jul. 15, 1991 [DE] Fed. Rep. of Germany ....... 4123415

[51] Int. Cl.$^5$ ............................................. G01R 31/00
[52] U.S. Cl. ................................. 324/158 R; 324/96
[58] Field of Search ............ 324/73.1, 158 R, 158 D, 324/96; 340/715, 784; 257/48; 437/8; 356/369, 401, 400

[56] References Cited

U.S. PATENT DOCUMENTS

| | | | |
|---|---|---|---|
| 4,611,050 | 9/1986 | Barta et al. | 528/289 |
| 4,659,622 | 4/1987 | Barta et al. | 428/379 |
| 4,712,057 | 12/1987 | Pau | 324/158 R |
| 4,843,312 | 6/1989 | Hartman et al. | 324/158 R |
| 4,870,357 | 9/1989 | Young et al. | 324/158 R |
| 4,985,681 | 1/1991 | Brunner et al. | 324/158 R |
| 5,113,134 | 5/1992 | Plus et al. | 324/73.1 |

FOREIGN PATENT DOCUMENTS

| | | |
|---|---|---|
| 0129508 | 12/1984 | European Pat. Off. . |
| 0189777 | 8/1986 | European Pat. Off. . |
| 0290066 | 11/1988 | European Pat. Off. . |
| 57-117230 | 1/1984 | Japan . |
| 62-127675 | 6/1987 | Japan . |

OTHER PUBLICATIONS

"Display of Voltage Distribution on Microcircuits", by J. J. Destafeno et al, IBM Technical Disclosure Bulletin, vol. 15, No. 8, Jan. 1973, pp. 2547-2548.

*Primary Examiner*—Vinh Nguyen
*Attorney, Agent, or Firm*—Hill, Steadman & Simpson

[57] ABSTRACT

Method for particle beam testing of substrates for liquid crystal displays (LCD). This invention is directed to methods wherein, given a substrate (SUB1) for a liquid crystal display, either potentials or, respectively, currents are set in defined fashion with a particle beam (S1, S2 and S4) and/or potentials are measured by detecting secondary electrons (S5) at different switch statuses of the switch elements (T) of the substrate (SUB1). The geometrical integrity and the electrical functionability of the substrate (SUB1) are thereby tested, even though, for example, a supplementary plane electrode is not present for forming a capacitor. An important advantage of the method is that faulty substrates can be repaired or can be segregated even before further-processing and, thus, costs can be reduced.

7 Claims, 2 Drawing Sheets

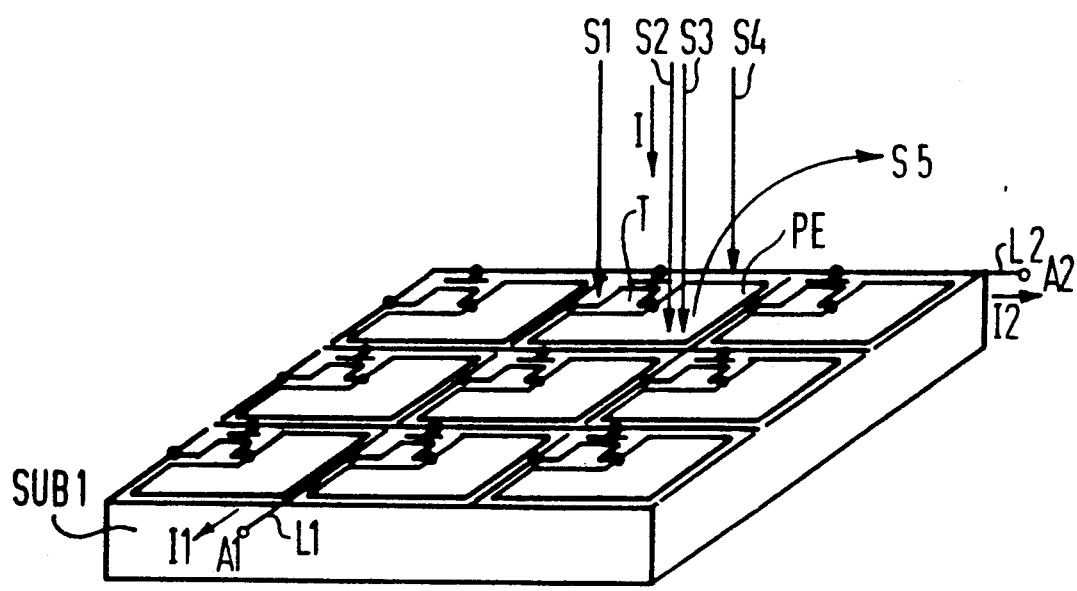

METHOD FOR PARTICLE BEAM TESTING OF SUBSTRATES FOR LIQUID CRYSTAL DISPLAYS (LCD)

BACKGROUND OF THE INVENTION

The present invention is directed to a method for testing a substrate for a liquid crystal display that has a plurality of picture elements, whereby the substrate is composed of a light-transmissive insulator member and whereby a plurality of plane electrodes, switch elements and control lines are applied onto the surface thereof, such that a respective plane electrode is connected to control lines via a switch element.

A method for non-contacting testing of line networks for shorts and interruptions is disclosed by European Patent reference EP 0 189 777 B1 (corresponding to U.S. Pat. No. 4,985,681).

SUMMARY OF THE INVENTION

The object of the present invention is to provide an improved method that allows a testing of the geometrical integrity, as well as, a testing of the electrical function, even though, for example, a supplementary plane electrode for forming capacitors is not situated on the substrate to be tested.

This object is inventively achieved in that respective control lines are brought to a defined potential and in that the resulting potential of the appertaining plane electrode is measured with secondary electron detection.

According to a further aspect of the present invention, a respective plane electrode has a defined current supplied to it by a particle beam and the resulting potential of this plane electrode is measured by secondary electron detection.

According to another aspect of the present invention, alternatively, a respective plane electrode has a defined current supplied to it and the currents resulting therefrom are measured in the appertaining control lines.

The advantage of the present invention is particularly that faulty substrates can be repaired or can already be eliminated before further-processing and, thus, costs can be eliminated.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

FIG. 2 depicts a substrate under test on which parts of picture elements are applied.

DESCRIPTION OF THE PREFERRED EMBODIMENT

Figure 1:
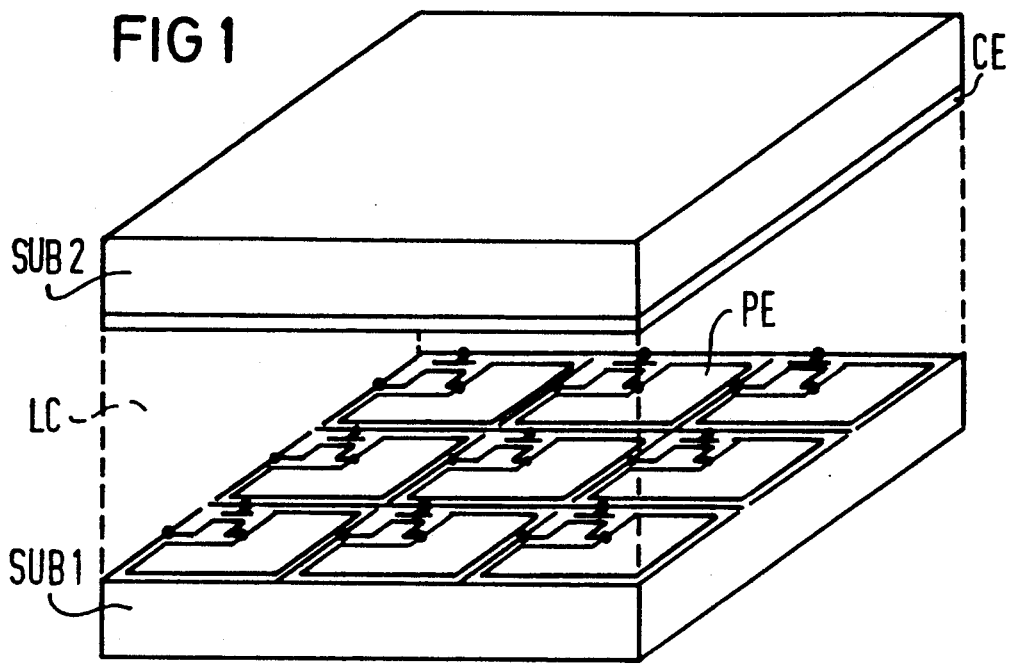
FIG. 1 is a perspective sectional view of a liquid crystal display that is composed of two substrates and of an intervening liquid crystal.

As may be seen from FIG. 1, liquid crystal displays (LCDs) are essentially composed of two substrates SUB1 and SUB2 between which a liquid crystal LC is enclosed. In the illustrated case, a plurality of plane electrodes are applied on the substrate SUB1 and a supplementary plane electrode CE is applied on the substrate SUB2. Together with, for example, the supplementary opposed plane electrode CE of the substrate, the plane electrode PE forms a capacitor in whose field long-chain liquid crystal molecules are aligned, as a result whereof the liquid crystal becomes light-transmissive in the region of the plane electrode PE. When separately testing the substrate SUB1 from the substrate SUB2, the intended mode of operation encounters difficulties since the capacitances formed by the plane electrodes, the liquid crystal and the supplementary plane electrode CE are not present.

FIG. 2 shows only the substrate SUB1 with a plurality of plane electrodes, switch elements in the form of transistors and control lines, whereby gate terminals of transistors of a row are connected matrix-like to a control line, source terminals of the MOS transistors of a column are connected matrix-like to a control line and the respective plane electrodes of the picture elements are connected matrix-like to the drain terminals of the MOS transistors. For example, the plane electrode PE of a picture element is connected to the drain terminal of a transistor T whose gate terminal is contacted by a control line L2 and whose source terminal is contacted by a control line L1. The line L1 has a line terminal A1 and the line L2 has a line terminal A2. A current in the line L1 is referenced I1 and a current in the line L2 is referenced I2. A particle beam S1 is directed onto the line L1 and a particle beam S4 is directed onto the line L2. A particle beam S2 is directed onto the plane electrode PE itself in order to supply a current I to the plane electrode PE. A particle beam S3 that causes secondary electrons S5 is directed onto the plane electrode PE separately from the particle beam S2. The separate particle beams S2 and S3 thereby indicate that, for setting a potential or a defined current I, these need not be identical with the particle beam S3 in terms of their properties, the latter serving the purpose of triggering secondary electrons. Thus, for example, it is conceivable that the particle beam S2 delivers a higher current I to the plane electrode PE than is delivered by the particle beam S3 that serves the purpose of measurement or that the particle beam S2 is composed of an electron beam and the particle beam S3 is composed of a laser beam that generates secondary electrons S5 in the form of photo electrons.

Figure 3:
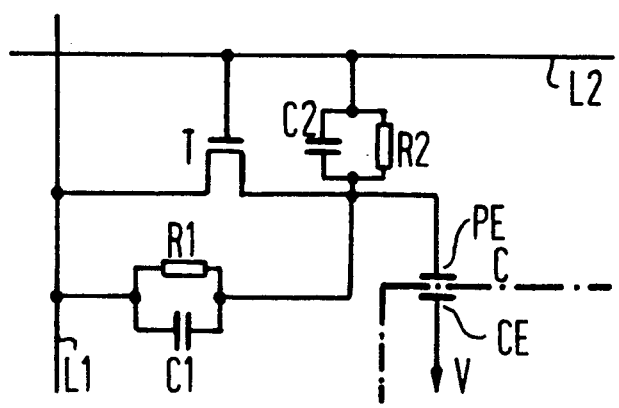
FIG. 3 is an electrical equivalent circuit diagram of a picture element.

FIG. 3 shows an electrical equivalent circuit diagram of a picture element with a MOS transistor T as a switch element whose source terminal is contacted by the control line L1 and whose gate terminal is contacted by the control line L2. A drain terminal of the MOS transistor T is connected to the plane electrode PE that, together with the common plane electrode CE, forms a capacitor C of the picture element, whereby the supplementary plane electrode CE is connected to the supply voltage terminal V. A section line that separates the two plane electrodes PE and CE from one another indicates the circuit division onto two substrates. FIG. 3 further depicts, the essential, parasitic switch elements, in the form of parallel connected resistor R1 and capacitor C1, between the drain terminal of the MOS transistor T and the control line L1, as well as, a parallel circuit composed of a resistor R2 and a capacitor C2 between the drain terminal of the MOS transistor T and the control line L2.

In addition to the described transistors, diodes or what are referred to as MIM elements (metal-insulatormetal) are also often used as switch elements, whereby, for example, a diode is respectively provided between a control line and the plane electrode of an image element or a MIM element is inserted between the plane electrode and a control line. The division of the switch elements and of the plane electrodes onto the two substrates SUB1 and SUB2 can also be implemented differently and the present embodiment is only one example.

In a first method of the present invention, control lines L1 and L2 that are connected via the MOS transistor T to the plane electrode PE are brought to a defined potential at every picture element within a setting time interval, whereby this can occur, for example, via the line terminal A1 or, respectively, A2 or via the particle beam S1 or, respectively, S4. As a result of the parasitic elements R1, C1, R2 and C2 shown in FIG. 3 and as a result of the MOS transistor T, a corresponding potential is established at the plane electrode PE. For measuring the potential of the plane electrode PE in this method, a particle beam S3 is directed onto the plane electrode PE within a measuring time interval and the secondary electrons S5 thereby triggered are identified. The plurality of secondary electrons that are incident into a detector is thereby dependent on the potential of the plane electrode PE since the forces of attraction or repulsion depend on the potential of the plane electrode PE. Deviations from the respective rated potential result for faulty picture elements and these, for example, can be easily interpreted with an electronic calculator. When lines are charged by a particle beam, then the charging must be cyclically repeated since the lines gradually discharge. The setting time interval is thereby selected such that the potentials on the control lines change in potential only within a defined measuring tolerance. The measurement time interval must thereby be optimally short so that no significant change in potential arises on the plane electrode PE.

A second inventive method for particle beam testing of a substrate for a liquid crystal display is that the defined current I is supplied to the plane electrode PE by the particle beam S2 and the secondary electrons S5 are triggered the particle beam S3 that is likewise directed onto the plane electrode PE and, thus, the potential of the plane electrode is measured. In many instances, the particle beam S2 will be identical to the particle beam S3 since the particle beam for supplying the current I is also suitable for triggering secondary electrons. The current I is carried of by the parasitic elements R1, C1, R2 and C2 indicated in FIG. 3 and by the switch element T, so that a defined potential is established on the plane electrode PE. This established potential can be respectively compared to a rated potential and a test result for a picture element can be formed therefrom.

In a third inventive method for particle beam testing of a substrate for a liquid crystal display, a defined current I is likewise supplied to the plane electrode PE. Here, however, it is not the potential of the plane electrode but the currents I1 and I2 that arise due to the parasitic elements R1, C1, R2 and C2 and the transistor T that are measured. The measurement of the currents I1 and I2 occurs via the line terminals A1 and A2 that are connected to external measuring contacts. In this method, for example, the measuring time interval can also lie within the setting time interval, i.e. the current I can also be supplied during the measuring time interval in order to obtain a stationary division of current.

In all three methods of the present invention, a measurement can occur either immediately after a setting time interval or after a defined waiting time. When the measurement is not carried out until after a defined waiting time, then it is errors in the time behavior of a picture element that are particularly identified. When the measurement is carried out after the setting time interval, it is possible to set various switch statuses of the switch element during the measuring time interval via the connected control lines. The control lines can thereby be set via the terminals A1 or, respectively, A2 or via the particle beam S1 or, respectively, S4.

The three methods of the present invention can also be combined, whereby a defined potential is produced on the line L2, for example via terminal A2, a defined current I is supplied to the plane electrode PE via a particle beam S2, the current I1 of the line L1 is measured via a terminal A1 and the potential of the plane electrode PE is detected via the secondary electrons S5 triggered by the particle beam S2.

An electron beam is especially suited as the particle beam. However, the photon beam of a laser can be used that produces secondary electrons in the form of photo electrons. An ion beam is also often used for repairing extremely fine interconnect structures and this also triggers secondary electrons. A testing method of the present invention can therefore be combined with a repair by utilizing an ion beam for the afore-mentioned jobs.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for particle beam testing comprising the steps of: providing a substrate for a liquid crystal display that has a plurality of picture elements, each of said picture elements having a switch element connected to a capacitor, the substrate having on a surface thereof a plurality of plane electrodes, switch elements of picture elements and control lines such that respectively one plane electrode of the plurality of plane electrodes is connected via at least one switch element to control lines; bringing control lines, that are connected via a respective switch element to a respective plane electrode, to a prescribed potential within a setting time interval, and as a result of parasitic elements associated with the respective switch element, a plane electrode potential being established at the respective plane electrode; directing a particle beam onto the respective plane electrode within a measuring time interval and detecting secondary electrons triggered by the particle beam and thereby measuring the plane electrode potential of the respective plane electrode; and comparing the measured potential to a respective rated potential and forming therefrom a test result of a picture element such that a picture element is identified as faulty when a value of the measured potential substantially deviates from a value of the respective rated potential.

2. The method according to claim 1, wherein the step of bringing control lines that are connected via a switch element to a plane electrode to a respectively prescribed potential via respective line terminals of the control lines.

3. The method according to claim 1, wherein the step of bringing control lines, that are connected via a switch element to a plane electrode, to a respectively prescribed potential by a particle beam.

4. The method according to claim 1, wherein the measuring time interval immediately follows the setting time interval.

5. The method according to claim 4, wherein the switch element is switched within the measuring time interval via the control lines connected to said switch element.

6. The method according to claim 1, wherein a defined waiting time is provided between the end of the setting time interval and the beginning of the measuring time interval.

7. The method according to claim 6, wherein the switch element is switched within the measuring time interval via the control lines connected to said switch element.

* * * * *